(12) United States Patent
Keeth et al.

(10) Patent No.: US 8,320,206 B2
(45) Date of Patent: Nov. 27, 2012

(54) STACKED DEVICE REMAPPING AND REPAIR

(75) Inventors: Brent Keeth, Boise, ID (US); Chris G. Martin, Boise, ID (US); Troy A. Manning, Meridian, ID (US); Joe M. Jeddeloh, Shoreview, MN (US); Timothy B. Cowles, Boise, ID (US); Jim Rehmeyer, Boise, ID (US); Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/946,592

(22) Filed: Nov. 15, 2010

(65) Prior Publication Data

US 2011/0060888 A1    Mar. 10, 2011

Related U.S. Application Data

(62) Division of application No. 12/246,882, filed on Oct. 7, 2008, now Pat. No. 7,835,207.

(51) Int. Cl.
*G11C 7/00* (2006.01)
*G11C 7/02* (2006.01)

(52) U.S. Cl. ............... 365/200; 365/51; 365/189.17; 365/189.2; 365/202; 365/209; 365/230.01; 711/E12.078

(58) Field of Classification Search .............. 365/51, 365/189.2, 189.17, 200, 230.01; 711/202, 711/209, E12.078
See application file for complete search history.

(56) References Cited

U.S. PATENT DOCUMENTS

| | | | |
|---|---|---|---|
| 6,208,545 B1 | 3/2001 | Leedy | |
| 6,466,053 B2 | 10/2002 | Duesman | |
| 7,193,239 B2 | 3/2007 | Leedy | |
| 7,835,207 B2 | 11/2010 | Keeth et al. | |
| 2004/0032781 A1 | 2/2004 | Cowles et al. | |
| 2006/0044896 A1 | 3/2006 | Taussig et al. | |
| 2006/0083099 A1 | 4/2006 | Bae et al. | |
| 2006/0221752 A1 | 10/2006 | Fasoli et al. | |
| 2006/0237833 A1* | 10/2006 | Klein et al. | 257/686 |
| 2006/0242497 A1 | 10/2006 | Cowles et al. | |
| 2008/0198646 A1 | 8/2008 | Park et al. | |
| 2010/0038802 A1* | 2/2010 | Chen et al. | 257/777 |
| 2010/0070696 A1* | 3/2010 | Blankenship | 711/105 |
| 2010/0085825 A1 | 4/2010 | Keeth et al. | |
| 2010/0155912 A1 | 6/2010 | Patterson | |

FOREIGN PATENT DOCUMENTS

| | | |
|---|---|---|
| WO | WO-2010042496 A2 | 4/2010 |
| WO | WO-2010042496 A3 | 7/2010 |

OTHER PUBLICATIONS

"European Application Serial No. 09819740.3, Extended Search Report mailed Feb. 28, 2012", 7 pgs.

* cited by examiner

*Primary Examiner* — Ly D Pham
(74) *Attorney, Agent, or Firm* — Schwegman, Lundberg & Woessner, P.A.

(57) ABSTRACT

Various embodiments include apparatus, systems, and methods having multiple dice arranged in a stack in which a defective cell may be replaced by a spare cell on the same die or a different die. Other embodiments are described.

16 Claims, 8 Drawing Sheets

STACKED DEVICE REMAPPING AND REPAIR

PRIORITY APPLICATION

This application is a divisional of U.S. application Ser. No. 12/246,882, filed Oct. 7, 2008 now U.S. Pat. No. 7,835,207, which is incorporated herein by reference in its entirety.

BACKGROUND

Computers and other electronic products, e.g., televisions, digital cameras, and cellular phones, often use memory devices having memory cells to store data and other information. A memory device usually includes a semiconductor die where memory cells are formed. Some memory device may include spare memory cells to replace defective memory cells in the device so that the device may remain usable. Some memory devices may include multiple dice. In these devices, dealing with defective memory cells among the multiple dice may pose a challenge.

DETAILED DESCRIPTION

Figure 1:
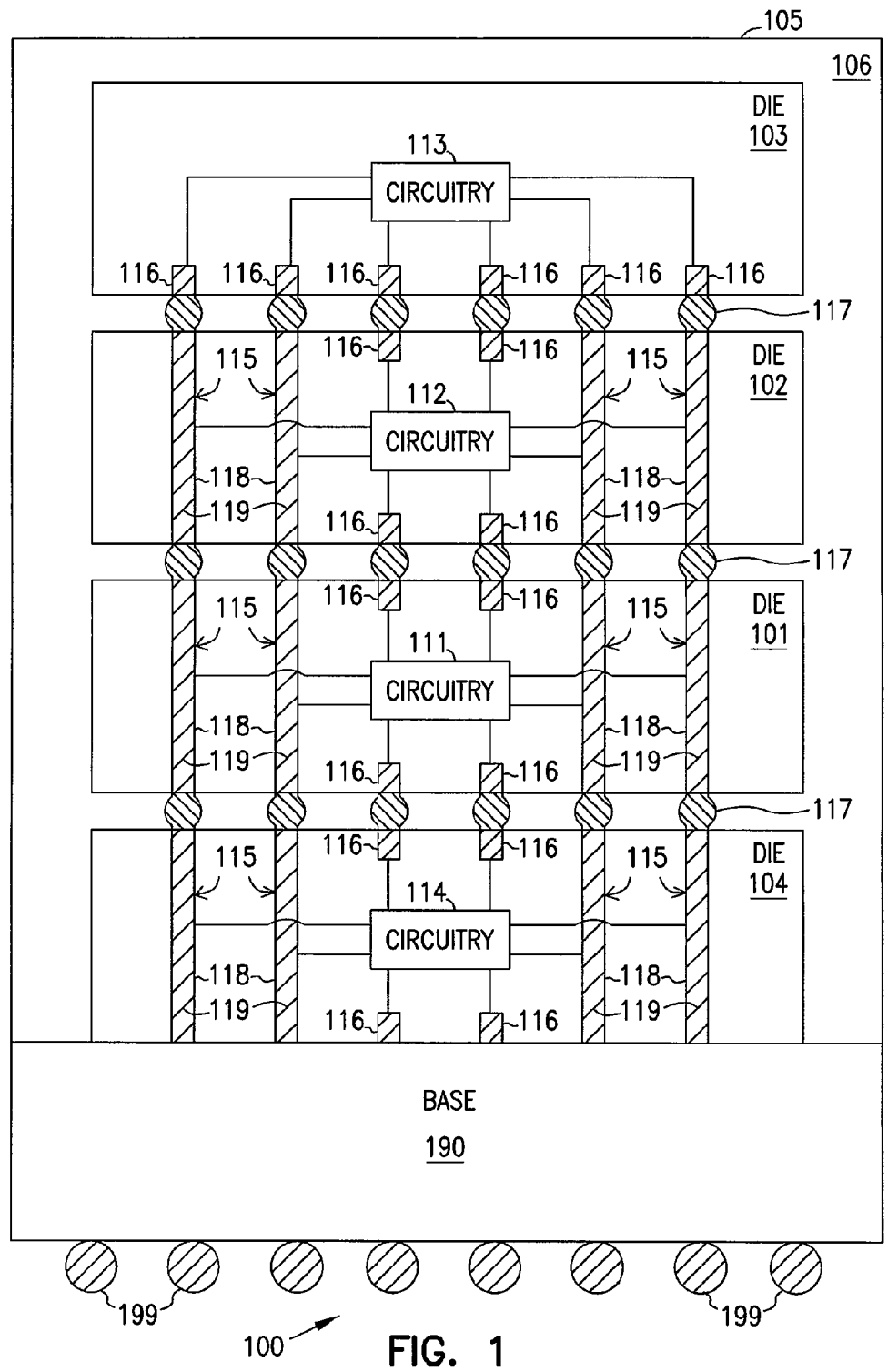
FIG. 1 shows a partial cross-section of an IC package including dice 1 arranged in a stack according to various embodiments of the invention.

FIG. 1 shows a partial cross-section of an IC package 100 including dice 101, 102, 103, and 104 arranged in a stack according to various embodiments of the invention. Each of dice 101, 102, 103, and 104 may include a semiconductor-based material (e.g., silicon) where circuitry 111, 112, 113, and 114 are formed. One or more of circuitry 111, 112, 113, and 114 may operate to perform storing function (e.g., functions of a memory device) and logic function (e.g., functions of a memory controller or a processor). IC package 100 may include conductive paths 115 and 116 and conductive elements (e.g., solder) 117 to allow communication to and from dice 101, 102, 103, and 104. As shown in FIG. 1, some of the conductive paths of IC package 110 (e.g., conductive paths 115) may go through the die and inside vias 118 (sometimes called through-holes), and some other conductive paths (e.g., conductive paths 116) may only partially go into the die. Conductive paths 115 may include conductive material 119 filled inside vias 118 that are formed in the die and extended from one surface of the die to another surface of the die.

IC package 100 may also include a base 190 and an enclosure 105 in which an interior 106 may be filled with insulation material such as epoxy-based molding compound. Base 190 may include conductive paths (not shown in FIG. 1) coupled to conductive elements 199 and conductive paths 115 and 116 to provide electrical connections between dice 101, 102, 103, and 104 and conductive elements 199 for communication between dice 101, 102, 103, and 104 with external devices, such as memory controllers and processors. Base 190 may include an inorganic (e.g., ceramic) substrate or an organic substrate. An example of an organic substrate includes a multi-layer bismaleimide triazine (BT) substrate. FIG. 1 shows conductive elements 199 having a ball shape as an example. Conductive elements 199, however, may include other shapes such as a pin shape, rectangular shape, and others.

As shown in FIG. 1, among the dice, die 104 may be located closest to base 190 and may also be called an interface die to provide an interface communication between IC package 100 and other external devices. Circuitry 114 may include components to control at least some operations in IC package 100 and exchange information (e.g., signals) between IC package 100 and other external devices through conductive elements 199.

Dice 101, 102, 103, and 104 may include the dice described below with reference to FIG. 2 through FIG. 5.

Figure 2:
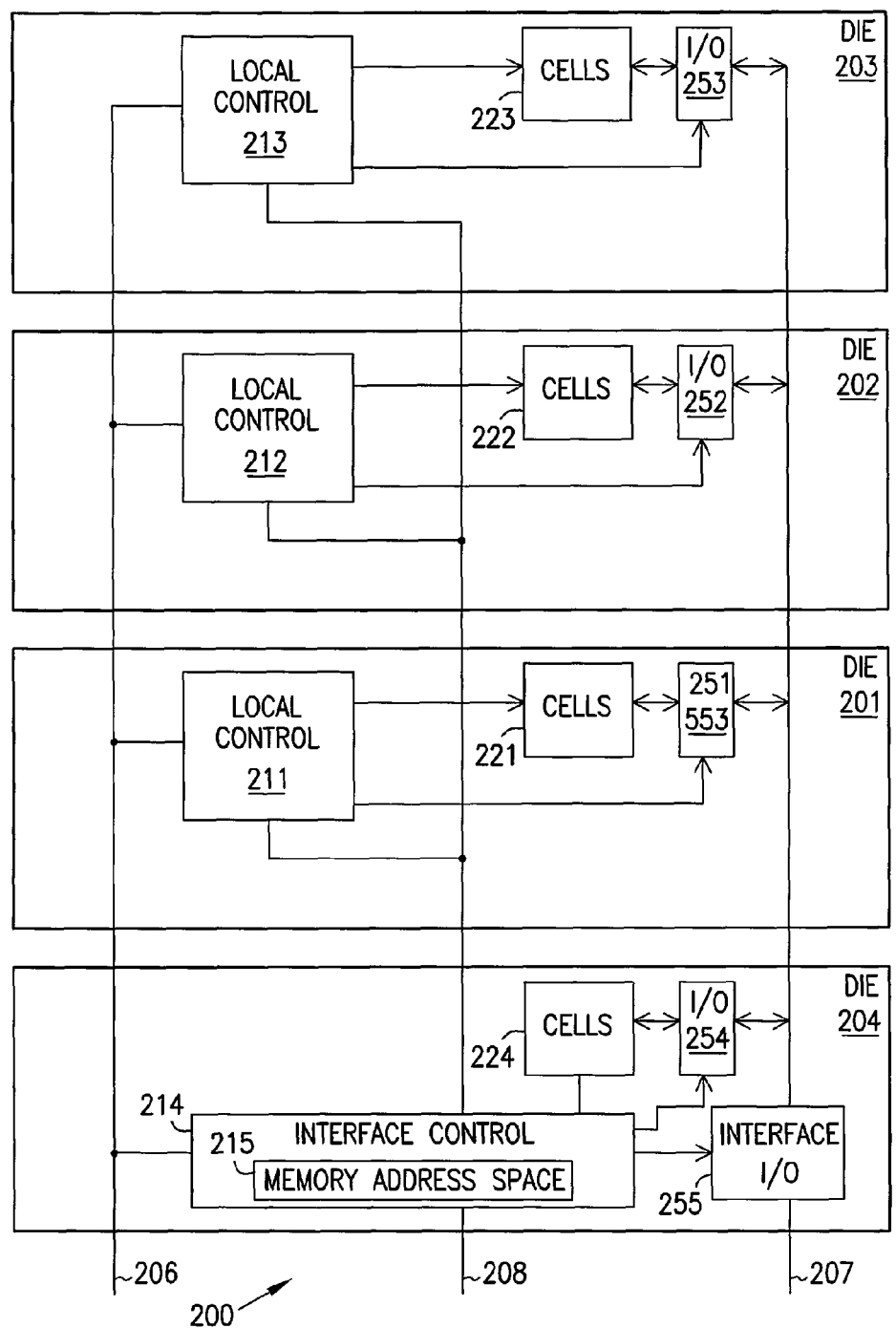
FIG. 2 is a schematic diagram showing a stacked device according to various embodiments of the invention.

FIG. 2 is a schematic diagram showing a stacked device 200 according to various embodiments of the invention. Stacked device 200 may include dice 201, 202, 203, and 204, which may be arranged in a stack similar to or identical to dice 101, 102, 103, and 104 of FIG. 1. As shown in FIG. 2, die 204 may be called interface die 204. Die 201, 202, and 203 may include local control circuits 211, 212, and 213, respectively, to control operations in respective dice 201, 202, and 203. For example, these local control circuits may respond to signals (e.g., address signals) on lines (e.g., address bus) 206 to respectively access cells 221, 222, and 223 to either write data into or read data from these cells. Die 201, 202, 203, 204 may include input/output (I/O) circuits 251, 252, 253, and 254, respectively, to transfer data to and from cells 221, 222, 223, and 224. Interface die 204 may include an interface control circuit 214 to receive control information from lines (e.g., control lines) 208 to control operations of interface die 204 and stacked device 200. Interface die 204 may also include an interface I/O 255 to transfer data to and from stacked device 200 through lines (e.g., data bus) 207.

FIG. 2 shows an example of stacked device 200 having four dice. However, the number of dice of stacked device 200 may vary.

Cells 221, 222, 223, and 224 may include non-defective cells, defective cells, and spare cells. Some of the non-defective cells may become defective during or after manufacturing. However, FIG. 2 shows only "cells" for simplicity. In this description, a "defective" cell may include both a cell that is actually defective and a cell that has been deemed to be "defective", regardless of whether the cell that has been deemed to be "defective" is actually defective.

In FIG. 2, each of dice 201, 202 and 203 may include functions of a memory device, e.g., a dynamic-random-access memory (DRAM) device, to store information in non-defective cells among cells 221, 222, 223, and 224 or in both non-defective and spare cells among cells 221, 222, 223, and 224 if one or more of the spare cells have been used to replace one or more defective cells. Cells 221, 222, 223, and 224 may include the same or different cell types, such as DRAM cells and static-random-access memory (SRAM) cells. For example, cells 221, 222, 223, and 224 may include DRAM cells. In another example, cells 221, 222, and 223 may include DRAM cells, and cells 224 may include SRAM cells, erasable programmable read-only memory (EPROM) cells, electrically erasable programmable read-only memory (EEPROM) cells, magnetoresistive random-access memory (MRAM) cells, or other types of memory cells.

In each die, defective cells that are discovered before the die is arranged in stacked device 200 may have been replaced by spare cells. Thus, available cells for use in stacked device 200 may include both non-defective cells and spare cells that have been used to replace defective cells. Some spare cells may be unused. In some cases, stacked device 200 may omit cells 224.

As described above, stacked device 200 may include spare cells to replace defective cells. Alternatively, stacked device 200 may include no spare cells such that cells 221, 222, 223, and 224 may include only non-defective cells and defective cells, or such that cells 224 may be omitted, and cells 221, 222, and 223 may include only non-defective cells and defective cells. In the alterative stacked device, defective cells (if any) are not replaced by spare cells and the stacked device is not discarded. Defective cells (if any) remain in the stacked device when stacked device 200 is operational. Thus, the alternative stacked device may have a reduced storage capacity if some of the cells 221, 222, 223, and 224 are defective. For example, if the alternative stacked device has a maximum storage capacity of "X" bytes when none of the cells 221, 222, 223, and 224 are defective, then the maximum storage capacity may be reduced to X−D1 (X minus D1) bytes, where "D1" corresponds to the number of bytes of data that the defective cells may store if they were not defective. In this example, X and D1 are real numbers.

Although, the alternative stacked device may have a reduced storage capacity, yield (e.g., die per wafer) in manufacturing the alternative stacked device may increase. For example, since defective cells are not replaced, spare cells normally used to replace defective cells may be excluded from the die. The exclusion of spare cells from the die may reduce die size. Therefore, yield may increase.

In the alternative stacked device above, although no spare cells are included, any defective cells from one die may still be replaced by non-defective cells from the same die or from one or more other dice.

In another configuration of stacked device 200, none of the dice 201, 202, and 203 may include spare cells, only die 204 may include spare cells. In this configuration, spare cells of die 204 may replace some or all of defective cells in one or more of dice 201, 202, 203. A maximum storage capacity storage capacity (e.g., "Y" bytes) of stacked device 200 in this configuration may remain at a full level if the number of spare cells of die 204 is sufficient to replace all of defective cells in the stacked device. However, if the number of spare cells in die 204 is insufficient to replace all defective cells of dice 201, 202, and 203, then the maximum storage capacity of, e.g., Y bytes, of stacked device 200 may be reduced to Y−D2 (Y minus D2) bytes, where "D2" corresponds to the number of bytes of data that the defective cells may store if they were not defective. In this example, Y and D2 are real numbers.

In a further configuration of stacked device 200, spare cells may be included in at least one but fewer than all of dice 201, 202, 203, and 204. For example, spare cells may be included in only die 201 or only die 201 and die 204 to replace defective cells any die in the stacked device. A maximum storage capacity storage capacity (e.g., "Z" bytes) of stacked device 200 in this configuration may remain at a full level if the number of spare cells is sufficient to replace all of defective cells in the stacked device. However, if the number of spare cells is insufficient to replace all defective cells in the stacked device, then the maximum storage capacity, e.g., Z bytes, of the stacked device may be reduced to Z−D3 (Z minus D3) bytes, where "D3" corresponds to the number of bytes of data that the defective cells may store if they were not defective. In this example, Z and D3 are real numbers.

Stacked device 200 may map addresses in a memory address space 215 of stacked device 200 to available cells among cells 221, 222, and 223. Memory address space 215 may include addresses of all available cells that can be used by stacked device 200 or by another device, such as by a memory controller or a processor. Thus, memory address space 215 is a logical entity whereas cells 221, 222, and 223 are physical entity. For example, if cells 221, 222, and 223 have eight cells that are available for used, then memory address space 215 may include addresses 000, 001, 010, 011, 100, 101, 110, and 111 mapped to those eight cells. Alternatively, stacked device 200 may map addresses in memory address space 215 to available cells among cells 221, 222, 223, and 224. The example herein uses eight cells to help explaining the relationship between memory address space and physical cells. However, stacked device 200 may have numerous cells, e.g., millions or billions of cells.

Memory address space 215 may be a contiguous memory address space. For example, address space 215 may includes a contiguous address space with consecutive addresses such as 000, 001, 010, 011, 100, 101, 110, and 111 corresponding to eight memory cells. As shown in this example, address space 215 includes no skipped addresses from value 000 to value 111, indicating that all eight cells corresponding to these consecutive addresses are available for use. However, memory address space 215 may be noncontiguous in some situations. For example, after dice 201, 202, 203, and 204 are arranged in stacked device 200, one or more cells among cells 221, 222, and 223 may be discovered to be defective during additional testing of stacked device 200. The defective cell (or cells) in this situation may include a new defective cell, which is different from the defective cell that has been discovered before dice 201, 202, 203, and 204 are arranged in stacked device 200.

When a new defective cell is discovered, stacked device 200 may decide to replace the defective cell with a spare cell but it may have no more available spare cells. Stacked device 200, however, may include spare cells but decide to skip replacing the defective cell with an available spare cell. Alternatively, as mentioned above, stacked device 200 may include no spare cells. Thus, stacked device 200 may also skip replacing defective cells when it has no spare cells. In any of these situations, stacked device 200 may use interface die 204 to identify the defective cell and appropriately organizes memory address space 215 that is previously mapped to cells 221, 222, 223, and 224. Interface die 204 may organize memory address space 215 into an addressable memory address space portion and a non-addressable memory address space portion when at least one cell among cells 221, 222, 223, and 224 is identified as a defective cell. The addressable memory address space portion may include all addresses mapped to cells of stacked device 200 that are available for used. The non-addressable memory address space portion may include all addresses mapped to cells (e.g., defective cells) of stacked device 200 that are unavailable for used. Organizing memory address space 215 in stacked device 200 after a new defective cell is discovered may include remapping memory address space 215.

Figure 3:
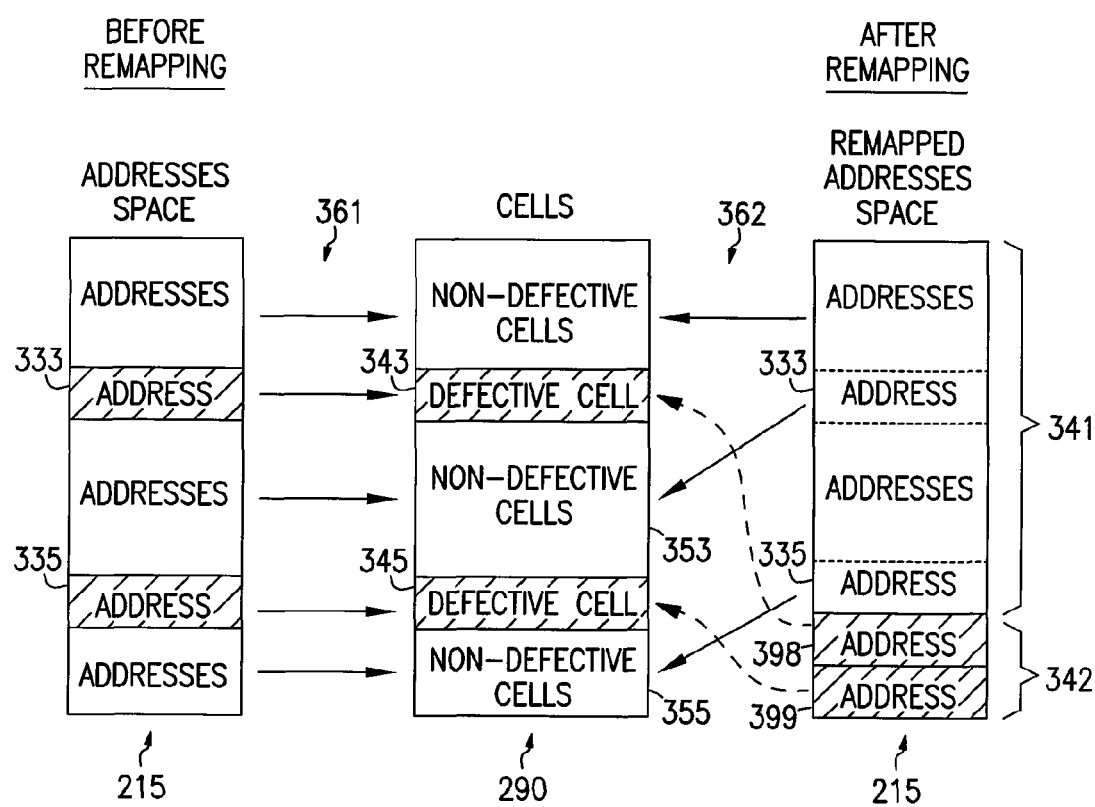
FIG. 3 is a diagram showing a memory address space of the stacked device of FIG. 2 before and after remapping, according to various embodiments of the invention.

FIG. 3 is a diagram showing a memory address space 215 of stacked device 200 before and after remapping according to various embodiments of the invention. In FIG. 3, cells 290 represent the combinations of cells 221, 222, 223, and 224 of FIG. 2. Memory address space 215 of FIG. 3, before remapping, represents the memory address space of stacked device 200 of FIG. 2 where addresses of memory address space 215 are mapped (indicated by arrows 361 in FIG. 3) to cells 290. Before remapping, cells 290 may include non-defective cells and defective cells where the defective cells have been discovered after dice 201, 202, 203, and 204 are arranged in stacked device 200. Memory address space 215 of FIG. 3, after remapping, represents the memory address space 215 of stacked device 200 of FIG. 2 where addresses of memory address space 215 are remapped (indicated by arrows 362 in FIG. 3) to cells 290 such that memory address space 215 is organized into addressable memory address space portion 341 and a non-addressable memory address space portion 342.

As shown in FIG. 3, after remapping, the addresses in the addressable memory address space portion 341 may be remapped to non-defective cells among cells 290, and the addresses in the non-addressable memory address space portion 342 may be remapped to one or more defective cells among cells 290. For example, before remapping, stacked device 200 may map address 333 to cell 343 and address 335 to cell 345. Cells 343 and 345 may be non-defective before dice 201, 202, 203, and 204 are arranged in stacked device 200. However, after dice 201, 202, 203, and 204 are arranged in stacked device 200, cells 343 and 345 may be defective. Thus, stacked device 200 may remap addresses 333 and 335 to other cells, which are non-defective. As shown in FIG. 3, stacked device 200 may remap (indicated by arrows 362) address 333 to one of non-defective cells 353 and remap address 335 to one of non-defective cells 355. Stacked device 200 may also remap addresses 398 and 399 in the non-addressable memory address space portion 342 to defective cells 343 and 345, respectively.

Addressable memory address space portion 341 may include a contiguous addressable memory address space portion such that the addresses in portion 341 have consecutive address values without skipped addresses. Similarly, non-addressable memory address space portion 342 may include a contiguous non-addressable memory address space portion such that the addresses in portion 342 have consecutive address values.

Addressable memory address space portion 341 may include addresses with either higher or lower values than addresses in non-addressable memory address space portion 342. For example, each of addresses (e.g., 398 or 399) in portion 342 may have a lower value than each of addresses (e.g., 333 or 335) in portion 341. FIG. 3 shows an example where stacked device 200 may remap memory address space 215 such that the addresses in non-addressable memory address space portion 342 have lower values than the addresses in addressable memory address space portion 341. However, stacked device 200 may remap memory address space 215 such that the addresses in non-addressable memory address space portion 342 have higher values than the addresses in addressable memory address space portion 341.

After remapping of memory address space 215, stacked device 200 may disable the addresses in non-addressable memory address space portion 342. For example, stacked device 200 may make the addresses in non-addressable memory address space portion 342 unavailable to components within stacked device 200 or to a device external to stacked device 200. Stacked device 200 may use interface die 204 to mask addresses in non-addressable memory address space portion 342 from an external device, such as a memory controller or a processor, and provide the external device with only the addresses in addressable memory address space portion 341. Stacked device 200 may provide the addresses in addressable memory address space portion 341 to the external device during an initialization period such as during a period when stacked device is powered up. Alternatively, stacked device 200 and the external device may communicate with each other (e.g., during an initialization period) such that stacked device 200 may provide the external device with an alternative remapping of the addresses in memory address space 215 if the external device requests the alternative remapping. The alternative remapping may include a noncontiguous addressable memory address space portion, which stacked device 200 and the external device may agree with each other. For example, in the alternative remapping, the external device may request stacked device 200 to remap memory address space 215 such that addresses remapped to available cells may be divided into multiple addressable memory address sub-portions within memory address space 215.

The description above with reference to FIG. 2 and FIG. 3 assumes cells 221, 222, 223, and 224 of stacked device 200 include no more available spare cells to replace a defective cell that is discovered after dice 201, 202, 203, and 204 are arranged in stacked device 200. The description above also assumes that stacked device 200 include one or more available spare cells but decides to skip replacing a defective cell that is discovered after dice 201, 202, 203, and 204 are arranged in stacked device 200. The description above further assumes that stacked device 200 may include no spare cells to replace defective cells.

As described above, an addressable memory address space portion may include all addresses mapped to cells of stacked device 200 that are available for used. The non-addressable memory address space portion may include all addresses mapped to cells (e.g., defective cells) of stacked device 200 that are unavailable for use. Thus, as shown in FIG. 3, the size of the addressable memory address portion of memory address space 215 (either before or after remapping) may be reduced by non-addressable memory address space portion, such as non-addressable memory address space portion 342.

As described above with reference to FIG. 2, stacked device 200 may include various configurations associated with maximum storage capacities of X bytes, Y bytes, and Z bytes, and reduced storage capacities of X−D1, Y−D2, and Z−D3 in the presence of defective cells. In FIG. 3, non-addressable memory address space portion 342 may represent addresses of defective cells that may store D1 bytes, D2 bytes, or D3 bytes of data if the defective cells were not defective. Addressable memory address space portion 341 may represent addresses of non-defective cells that may store X−D1 bytes, Y−D2, or Z−D3 bytes of data.

However, if a defective cell is discovered after dice 201, 202, 203, and 204 are arranged in stacked device 200, and stacked device 200 has available spare cells and decides to replace the defective cell with an available spare cell, then the size of the addressable memory address portion of memory address space 215 may remain at a full memory address space. The following description describes various techniques of replacing defective cells in stacked device, such as stacked device 200 of FIG. 2, when the defective cells are discovered after the dice of the stacked device are arranged in the stack. The various techniques of replacing defective cells described below, however, may also be used to replace defective cells when the defective cell are discovered before the dice are arranged in the stack but not have not been replaced by spare cells.

Figure 4:
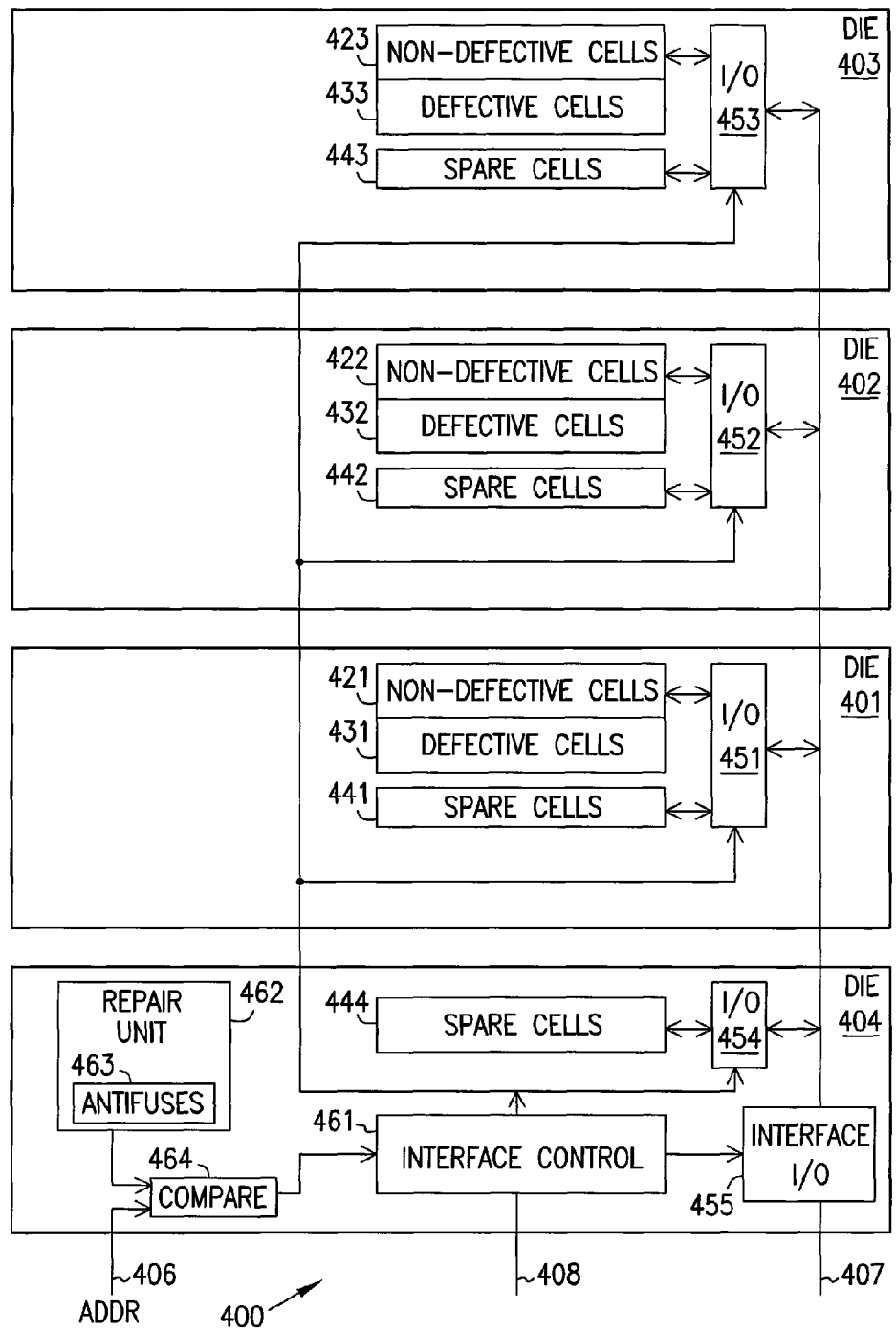
FIG. 4 is a schematic diagram showing a stacked device including an interface die according to various embodiments of the invention.

FIG. 4 is a schematic diagram showing a stacked device 400 including an interface die 404 according to various embodiments of the invention. Stacked device 400 may also include dice 401, 402, 403 arranged in a stack with interface die 404. Stacked device 400 may also include components located at their respective dice as shown in FIG. 4, such as non-defective cells 421, 422, and 423, defective cells 431, 432, and 433, spare cells 441, 442, 443, and 444, and I/O circuits 451, 452, 453, and 454, and interface I/O 455.

Stacked device 400 may include lines 406 to transfer address to stacked device 400, lines 407 to transfer data to and from non-defective cells 421, 422, and 423 and spare cells 441, 442, 443, and 444, and lines 408 to transfer control information to and from interface control circuit 461. Lines 406, 407, and 408 may include an address bus, a data bus, and a control bus, respectively. Stacked device 400 may also include other circuitry and connections to communicate with non-defective cells 421, 422, and 423 and spare cells 441, 442, 443, and 444 but are not shown in FIG. 4 to focus on the embodiments described herein.

Each of dice 401, 402 and 403 may include functions of a memory device (e.g., a DRAM) to store information in non-defective cells 421, 422, and 423 or in both non-defective cells 421, 422, and 423 and spare cells 441, 442, 443, and 444 if one or more of these spare cells have been used to replace one or more defective cells 431, 432, and 433. Non-defective cells 421, 422, and 423 and spare cells 441, 442, and 443 may include DRAM cells. Spare cells 444 may include SRAM cells, EPROM cells, EEPROM cells, MRAM cells, or other types of memory cells.

Stacked device 400 may use spare cells from a particular die to either replace defective cells in that particular die or replace defective cells located at one or more other dice. For example, stacked device 400 may use spare cells 441 from die 401 to either replace defective cells 431 or replace defective cells located at one or more of dice 402 and 403. Thus, in stacked device 400, a spare cell located at one die may replace a defective cell located at the same die or at a different die. For example, if all spare cells 441 in die 401 are used but a remaining portion of defective cells 431 at die 401 has not been replaced by spare cells, then stacked device 400 may use spare cells from one or more other dice (402, 403, and 404) to replace the remaining portion of defective cells 431.

Interface control circuit 461 may provide information to I/O circuits 451, 452, 453, and 454 to reroute a data path associated with a defective cell to a data path associated with a spare cell that is used to replace that defective cell. Stack device 400 may include a repair unit 462 having storage elements, such as antifuses 463, to store addresses of defective cells 431, 432, and 433. Stack device 400 may include a compare circuit 464 to compare an incoming address, e.g., address signals, ADDR on lines 406 with addresses in repair unit 462 to determine whether the incoming address matches an address of the defective cell.

If the incoming address matches the address of the defective cell, then interface control circuit 461 may cause appropriate I/O circuits 451, 452, 453, and 454 to appropriately write data into or read data from the spare cell that replaces the defective cell. If the incoming address does not match the address of the defective cell, then interface control circuit 461 may cause appropriate I/O circuits 451, 452, 453, and 454 to appropriately write data into or read data from the non-defective cell associated with the incoming address. I/O circuits 451, 452, 453, and 454 may write data into the spare cell if the incoming address is associated with a write operation of stacked device 400 and read data from the spare cell if the incoming address is associated with a read operation of stacked device 400.

As shown in FIG. 4, stacked device 400 may locate a compare circuit, such as compare circuit 464 at only interface die 404. Thus, among dice 401, 402, 403, and 404, only interface die 404 may have a compare circuit to compare an incoming address with an address of a defective cell to determine whether the incoming address matches the address of a defective cell.

Alternatively, stacked device 400 may be structured such that compare circuit 464 and least a portion of repair unit 462 may be located at each of dice 401, 402, and 403, so that dice 401, 402, and 403 (instead of interface die 404) may compare an incoming address with addresses in the repair unit to determine whether the incoming address matches an address of the defective cell. Each of dice 401, 402, and 403 may perform appropriate operation to determine whether or not to access a spare cell based on the comparison.

Stacked device 400 may include various configurations to access the cells in dice 401, 402, 403, and 404 and transfer data from these dice to lines 407 in various fashions during a read operation. In a first example configuration of stacked device 400, non-defective cells, defective cells, and spares cells in each of dice 401, 402, and 403 may include the same data paths to transfer data, e.g., the same data paths between these cells and their respective I/O circuits 451, 452, or 453. In this first example configuration, if none of the incoming addresses on lines 406 match the addresses of defective cells, stacked device 400 may access only non-defective cells (e.g., cells 421, 422, or 423) in die 401, 402, or 403 to read data from selected non-defective cells, based on the values of the incoming addresses. Then, stacked device 400 may transfer the data read from non-defective cells to lines 407. If at least one of the incoming addresses on lines 406 matches an address of a defective cell, stacked device 400 may access non-defective cells in die 401, 402, or 403 to read data from selected non-defective cells, based on the values of the incoming addresses. After accessing the non-defective cells, stacked device 400 may also access spare cells (e.g., cells 441, 442, 433, or 444) to read data from selected spare cells that replace defective cells. Then, stacked device 400 may combine data read from the selected non-defective cells and data read from the selected spare cells and transfer the combined data to lines 407 for further processing.

In a second example configuration of stacked device 400, non-defective cells and spares cells in each of dice 401, 402, and 403 may have different data paths to transfer data. For example, non-defective cells in each die may have one group of data paths between them and the respective I/O circuit of the die, and spare cells of the same die may have a different group of data paths between them and the respective I/O circuit of the die. In this second example configuration, data read from non-defective cells and from spare cells may be transferred in parallel (e.g., at the same or substantially the same time) on the different groups of data paths within each die during the same read operation.

For example, during a read operation, if at least one of the incoming addresses on lines 406 matches an address of a defective cell, stacked device 400 may access non-defective cells (e.g., cells 421, 422, or 423) in a selected die 401, 402, or 403 to read data from selected non-defective cells of the selected die, based on the values of the incoming addresses. Stacked device 400 may also access spare cells (e.g., cells 441, 442, or 433) of the selected die, in parallel with the access of the non-defective cells, to read data from selected spare cells that replace defective cells. Then, stacked device 400 may combine data read from the selected non-defective cells and data read from the selected spare cells and transfer the combined data to lines 407.

In the second example configuration, during a read operation, if none of the incoming addresses on lines 406 match the addresses of defective cells, stacked device 400 may access only non-defective cells (e.g., cells 421, 422, or 423) in die 401, 402, or 403 to read data from selected non-defective cells, based on the values of the incoming addresses. Then, stacked device 400 may transfer the data read from non-defective cells to lines 407.

In a third example configuration of stacked device 400, stacked device 400 may include multiplexing circuitry to selectively transfer data read from non-defective cells in one die and data read from spare cells in another die a during a read operation. In the first and second configurations of stacked device 400 described above, non-defective cells and spare cells may be located at the same die. In the third example configuration herein, non-defective cells and spare cells may be located at different dice.

During a read operation in the third example configuration, if at least one of the incoming addresses on lines 406 matches an address of a defective cell, stacked device 400 may access non-defective cells in a selected die (e.g., die 401) among dice 401, 402, and 403 to read data from selected non-defective cells, based on the values of the incoming addresses. Stacked device 400 may also access spare cells (e.g., cells 442) among spare cells 441, 442, 443, and 402 to read data from selected spare cells that replace defective cells of the selected die. Stacked device 400 may use the multiplexing circuitry to selectively transfer data read from the selected non-defective cells and the data read from selected spare cells to an interface controller, such as interface control circuit 461. Then, stacked device 400 may combine data read from the selected non-defective cells and data read from the selected spare cells and transfer the combined data to lines 407.

In the third example configuration, during a read operation, if none of the incoming addresses on lines 406 match the addresses of defective cells, stacked device 400 may access only non-defective cells (e.g., cells 421, 422, or 423) in die 401, 402, or 403 to read data from selected non-defective cells, based on the values of the incoming addresses. Then, stacked device 400 may transfer the data read from non-defective cells to lines 407.

Figure 5:
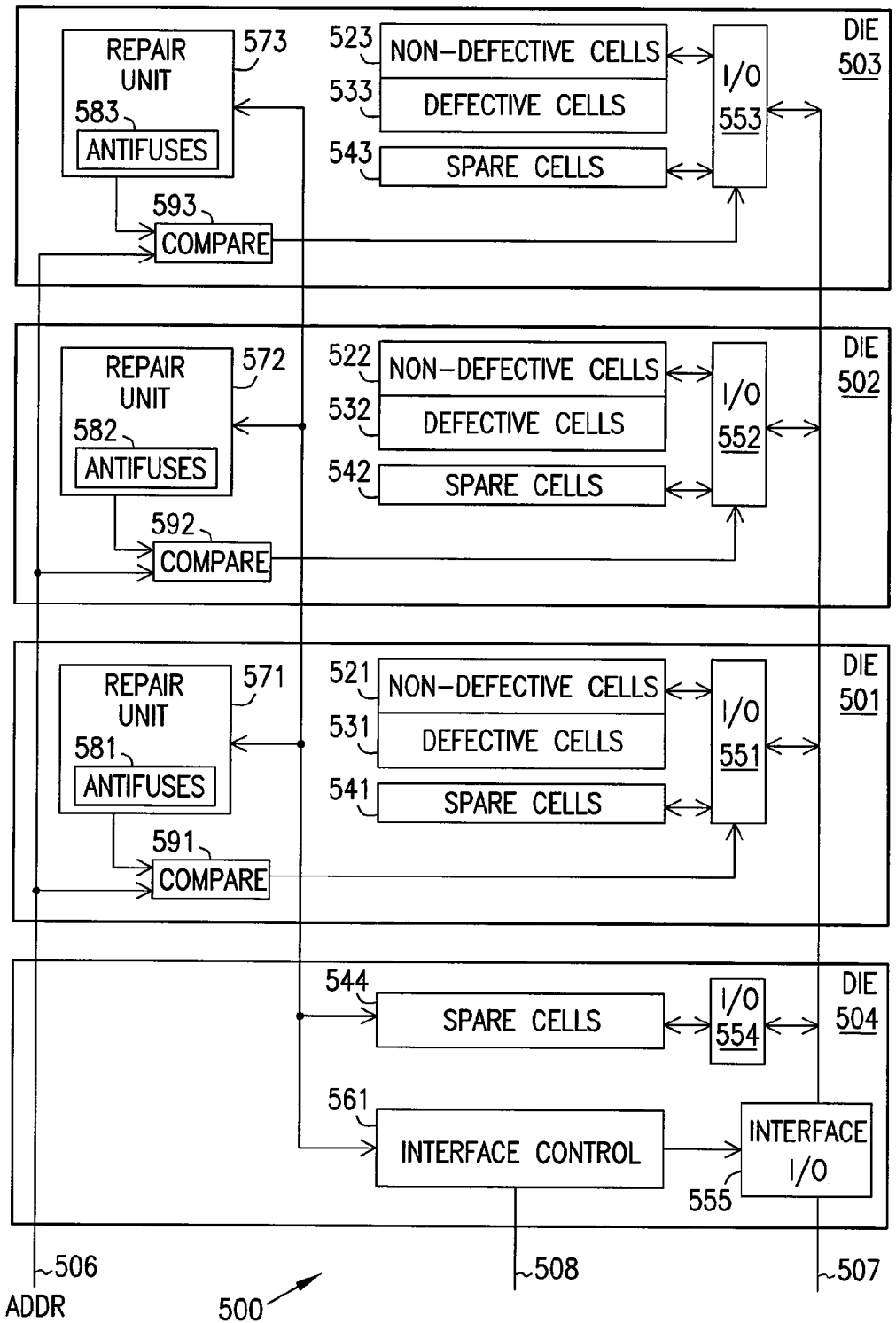
FIG. 5 is a schematic diagram showing a stacked device including dice having repair units and compare circuits, according to various embodiments of the invention.

FIG. 5 is a schematic diagram showing a stacked device 500 including dice 501, 502, and 503 having repair units 571, 752, and 573 compare circuits 591, 592, and 593 at dice 501, 502, and 503, according to various embodiments of the invention. Stacked device 500 may include components located at their respective dice as shown in FIG. 5, such as an interface die 504 arranged in a stack with dice 501, 502, and 503. Stacked device 500 may include non-defective cells 521, 522, and 523, defective cells 531, 532, and 533, spare cells 541, 542, 543, and 544, and I/O circuits 551, 552, 553, and 554. As shown in FIG. 5, stacked device 500 may locate repair units 571, 752, and 573 compare circuits 591, 592, and 593 at only dice 501, 502, and 503. Thus, in stacked device 500, dice 501, 502, and 503, instead of interface die 504, may determine whether the incoming address matches the address of the defective cell.

Stacked device 500 may include lines 506 to transfer address to stacked device 500, lines 507 to transfer data to and from non-defective cells 521, 522, and 523 and spare cells 541, 542, 543, and 544, and lines 508 to transfer control information to and from interface control circuit 561. Stacked device 500 may also include other circuitry and connections to communicate with non-defective cells 521, 522, and 523 and spare cells 541, 542, 543, and 544 but are not shown in FIG. 5 to focus on the embodiments described herein.

Each of dice 501, 502 and 503 may include functions of a memory device (e.g., a DRAM) to store information in non-defective cells 521, 522, and 523 or in both non-defective cells 521, 522, and 523 and spare cells 541, 542, 543, and 544 if one or more of these spare cells have been used to replace one or more defective cells 531, 532, and 533. Non-defective cells 521, 522, and 523 and spare cells 541, 542, and 543 may include DRAM cells. Spare cells 544 may include SRAM cells.

In stacked device 500, a spare cell located at one die may replace a defective cell located at any die. Thus, in stacked device 500, a defective cell may be located at one die and a spare cell replacing that defective cell may be located at either the same die or at a different die.

Each repair unit 571, 572, or 573 in a die may include antifuses 581, 582, or 583 to store addresses of defective cells in that die. For example, stacked device 500 may perform an antifuse programming operation to cause antifuses 581 at appropriate states, such as "blown or un-blown" states, to indicate addresses of the defective cells. Each compare circuit 591, 592, or 593 in a die may compare an incoming address ADDR on lines 506 with addresses in the corresponding repair unit 571, 572, or 573 in the same die to determine whether the incoming address matches an address of the defective cell in that die.

If the incoming address matches the address of the defective cell, then the compare circuit (or local control circuit, which is not shown in FIG. 5) of the die may cause appropriate I/O circuit 551, 552, 553, or 554 of the die to write data into or read data from the spare cell that replaces the defective cell. For example, if the defective cell is located at die 501 and the spare cell is located at interface die 504, then die 501 may access the spare cell on interface die 504 to write data into or read data from the spare cell that replaces the defective cell. If the incoming address does not match the address of the defective cell, then the compare circuit of the die may cause appropriate I/O circuit 551, 552, 553, or 554 to appropriately write data into or read data from the non-defective cell associated with the incoming address.

As shown in FIG. 5, stacked device 500 may locate compare circuits, such as compare circuits 591, 592, and 593, in only in dice 501, 502, and 503. Thus, among dice 501, 502, 503, and 504, only dice 501, 502, and 503 may compare an incoming address with an address of a defective cell to determine whether the incoming address matches the address of the defective cell. Also, among dice 501, 502, 503, and 504, only the dice 501, 502, and 503 may access the spare cells to either write data into or read data from the spare cell if an incoming address matches an address of the defective cell, in which the spare cell has been used to replace the defective cell.

Stacked device 500 may include various configurations to access the cells in dice 501, 502, 503, and 504 and transfer data from these dice to lines 507 in various fashions during a read operation. For example, stacked device 500 may include one or more of the first, second, and third example configurations described above with reference to FIG. 4.

Figure 6:
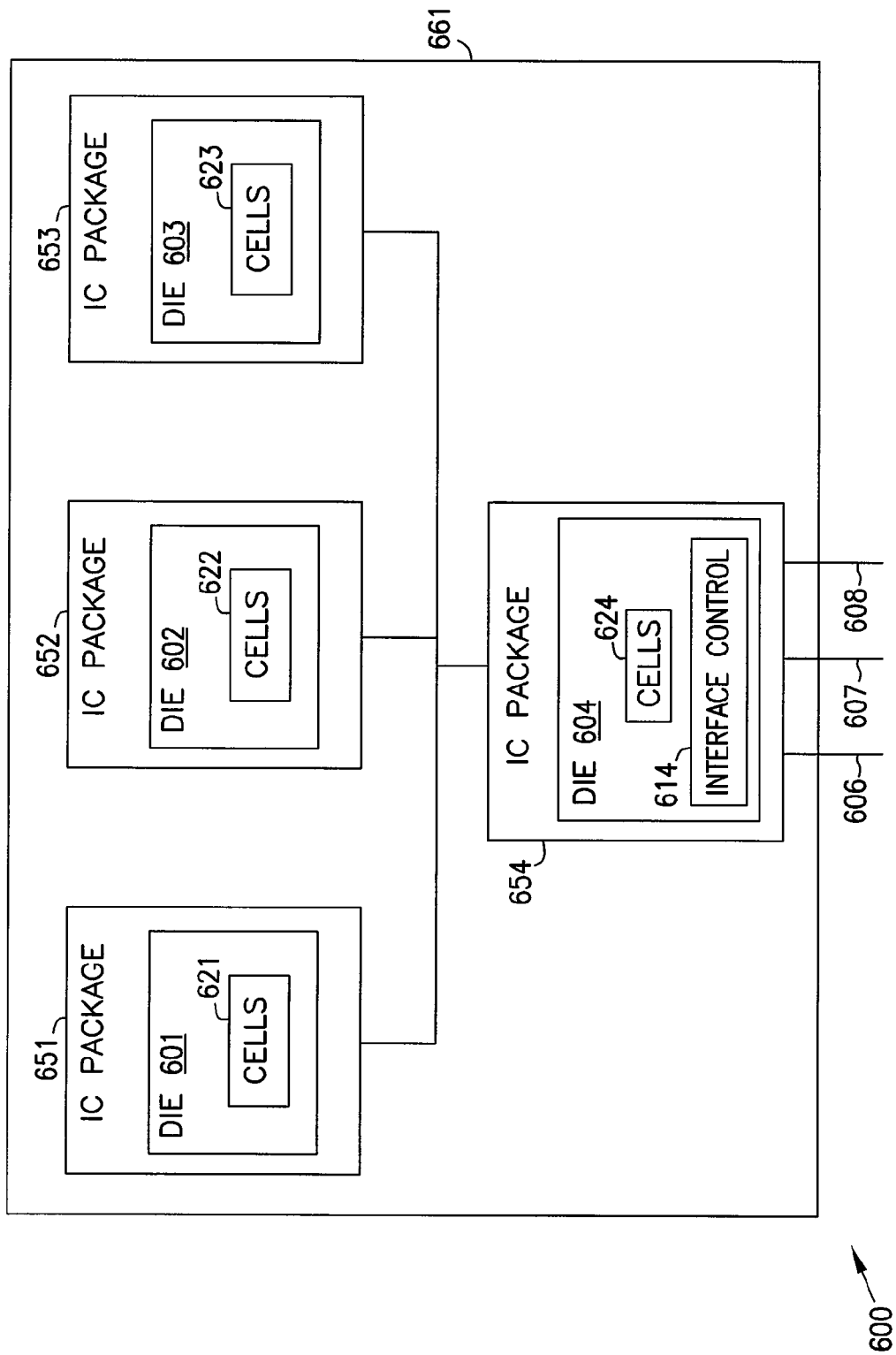
FIG. 6 shows an apparatus including IC packages according various embodiments of the invention.

FIG. 6 shows an apparatus 600 including IC packages 651, 652, 653, and 654 according various embodiments of the invention. IC packages 651, 652, 653, and 654 may include corresponding dice 601, 602, 603, and 604. Each die may include cells 621, 622, 623, or 624, which may be similar to or identical to cells 221, 222, 223, or 224 of stacked device of FIG. 2.

The arrangement of apparatus 600 may be comparable to the arrangement of stacked device 200, 400, or 500 of FIG. 2, FIG. 3, or FIG. 5. For example, one of the dice 601, 602, 603, and 604 of apparatus 600, e.g., die 604, may include an interface control circuit 614 to control transfer of data and other information to and from dice 601, 602, 603, and 604, based on address, data, and control information on lines 606, 607, and 608, respectively.

Apparatus 600, however, is different from stacked device 200, 400, or 500 of FIG. 2, FIG. 3, or FIG. 5 in that dice 601, 602, 603, and 604 of apparatus 600 may be enclosed in different IC packages 651, 652, 653, and 654, whereas the dice in stacked device 200, 400, or 500 of FIG. 2, FIG. 3, or FIG. 5 may be enclosed in the same IC package. As shown in FIG. 6, IC packages 651, 652, 653, and 654 of apparatus 600 may be located in a board (e.g., circuit board) 661 to form a part of a memory module, such as a dual in-line memory module (DIMM). FIG. 6 shows an example where each of IC packages 651, 652, 653, and 654 includes only a single die. However, one or more or IC packages 651, 652, 653, and 654 may alternatively include multiple dice in which the multiple dice may be arranged in a stack. Apparatus 600 may be configured to perform activities similar to or identical to those described above with reference to FIG. 1 through FIG. 6.

Figure 7:
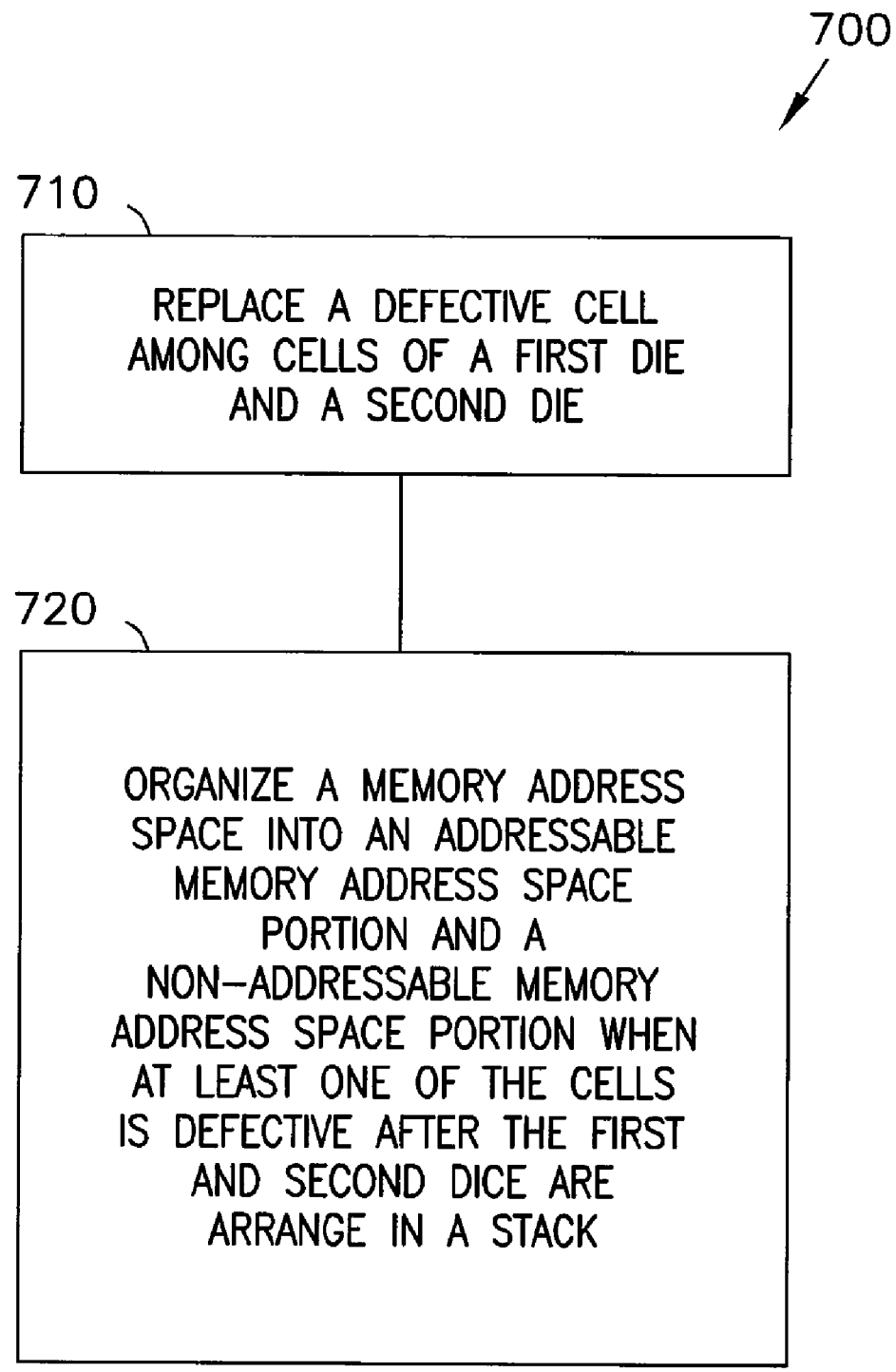
FIG. 7 is a flowchart showing a method of replacing defective cells and organizing a memory address space in a stacked device according to various embodiments of the invention.

FIG. 7 is a flowchart showing a method 700 of replacing defective cells and organizing a memory address space in a stacked device according to various embodiments of the invention. Method 700 may be used in an IC package and a stacked device that are similar to or identical to IC package 100 and stacked devices 200, 400, and 500, and apparatus 600 described above with reference to FIG. 1 through FIG. 6. Thus, the components of apparatus and devices used in method 700 may include the components of IC package 100 and stacked devices 200, 400, and 500, and apparatus 600 described above with reference to FIG. 1 through FIG. 6. In FIG. 7, activity 710 of method 700 may include replacing a defective cell among cells of at least one of a first die and a second die with a spare cell. Activity 720 may include organizing a memory address space into an addressable memory address space portion and a non-addressable memory address space portion when at least one of the cells is defective after the first and second dice are arranged in a stack. The memory address space may include addresses mapped to the cells. Method 700 may include other activities similar to or identical to the activities of replacing defective cells and organizing a memory address space described above with reference to FIG. 1 and FIG. 6. Various embodiments may have more or fewer activities than those illustrated in FIG. 7.

Figure 8:
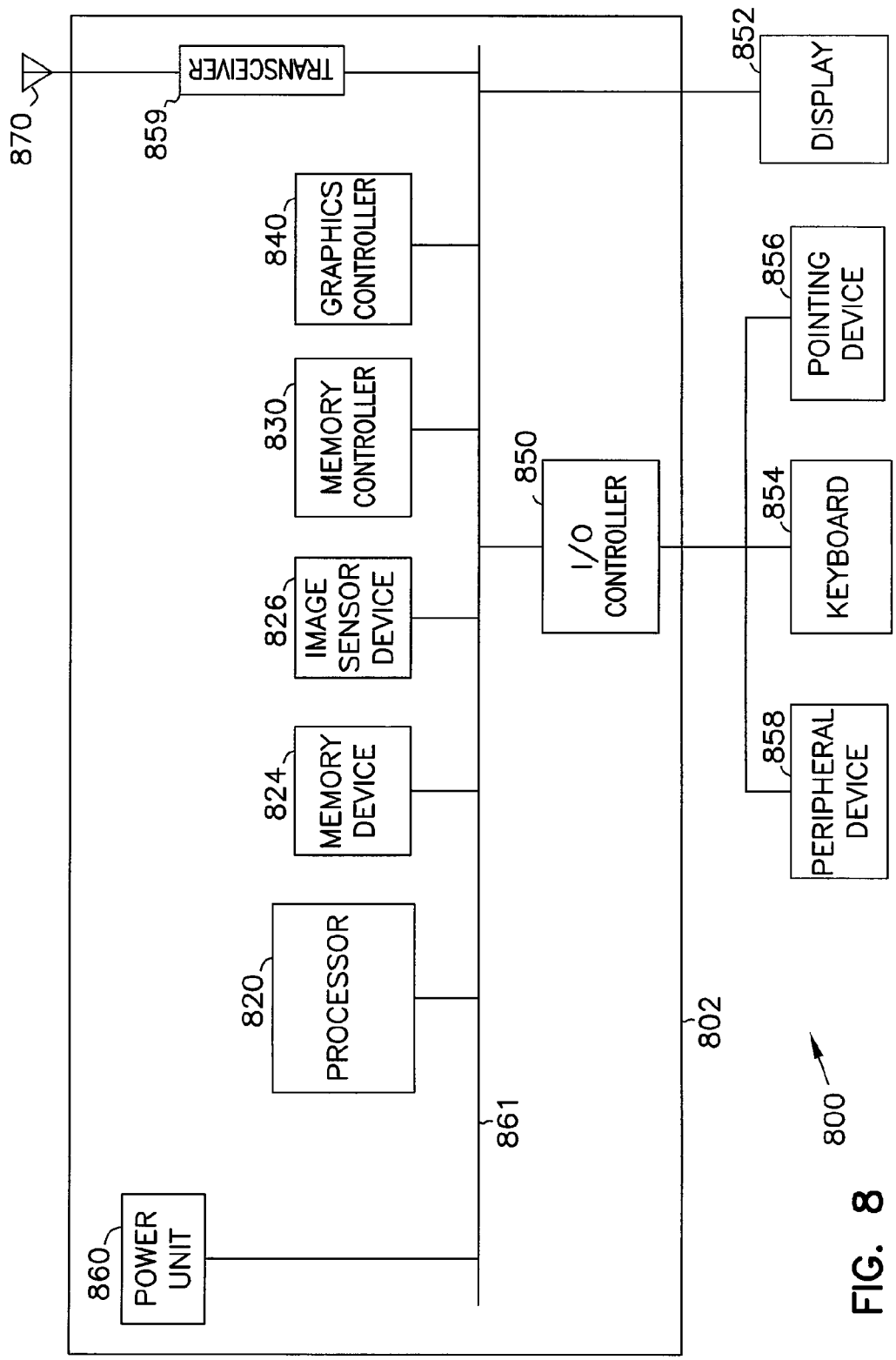
FIG. 8 shows a system according to various embodiments of the invention.

FIG. 8 shows a system 800 according to various embodiments of the invention. System 800 may include one or more of a processor 820, a memory device 824, an image sensor device 826, a memory controller 830, a graphics controller 840, an I/O controller 850, a display 852, a keyboard 854, a pointing device 856, a peripheral device 858, a transceiver 859, and a power unit 860. System 800 may also include a bus 861 to transfer information among the components of system 800 and provide power to at least some of these components. System 800 may further include a board (e.g., mother board) 802 where some of the components of system may be attached, and an antenna 870 to wirelessly transmit and receive information to and from system 800. Transceiver 859 may operate to transfer information between antenna 870 and one or more of the components of system 800 (e.g., at least one of processor 820 and memory device 824).

Image sensor device 820 may include a complementary metal-oxide-semiconductor (CMOS) image sensor having a CMOS pixel array or charge-coupled device (CCD) image sensor having a CCD pixel array.

Display 852 may include an analog display or a digital display. Display 852 may receive information from other components. For example, display 852 may receive information that is processed by one or more of processor 820, memory device 824, image sensor device 826, and graphics controller 840 to display information such as text or images.

Processor 820 may include a general-purpose processor or an ASIC. Processor 820 may include a single core processor or a multi-core processor. Processor 820 may execute one or more programming commands to process information. The information may include information provided by one or more components of system 800 such as memory device 824 and image sensor device 826.

Memory device 824 may include a volatile memory device, a non-volatile memory device, or a combination of both. For example, memory device 824 may include a DRAM device, an SRAM device, a flash memory device, phase change memory device, or a combination of these memory devices.

Memory device 824 may include an embodiment of one or more of the various devices described herein, such as stacked devices 200, 400, and 500, and apparatus 600 described above with reference to FIG. 1 through FIG. 6. Processor 820, or memory device 824, or both, may be included in an IC package such as IC package 100 of FIG. 1.

The illustrations of apparatus (e.g., IC package 100 and stacked devices 200, 400, and 500, and apparatus 600) and systems (e.g., system 800) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, apparatus (e.g., IC package 100 and stacked devices 200, 400, and 500, and apparatus 600) and systems (e.g., system 800) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., IC package 100 and stacked devices 200, 400, and 500, and apparatus 600) and systems (e.g., system 800), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, hand-held computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatus, systems, and methods having a first die including cells, and a second die arranged in a stack with the first die and configured to organize a memory address space into an addressable memory address space portion and a non-addressable memory address space portion when at least one of the cells is defective after the first and second dice are arranged in the stack, the memory address space including addresses mapped to the cells. The memory address space may include addresses mapped to the cells. One or more embodiments described herein also include apparatus, systems, and methods for replacing a defective cell among cells of a first die and a second die in a stack with a spare cell. Other embodiments including additional apparatus, systems, and methods are described above with reference to FIG. 1 through FIG. 8.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of other embodiments. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
   a first die including cells; and
   a second die arranged in a stack with the first die and configured to organize a memory address space into an addressable memory address space portion and a non-addressable memory address space portion when at least one of the cells is defective after the first and second dice are arranged in the stack, the memory address space including addresses mapped to the cells, wherein the second die is configured to mask at least one address of at least one defective cell among the cells from an external device.

2. The apparatus of claim 1, wherein an address in the addressable memory address space portion is mapped to a non-defective cell among the cells and an address in the non-addressable memory address space portion is mapped to a defective cell among the cells.

3. The apparatus of claim 1, wherein the second die is configured to remap an address of a defective cell among the cells to a non-defective cell among the cells.

4. An apparatus comprising:
   a first die including cells; and
   a second die arranged in a stack with the first die and configured to organize a memory address space into an addressable memory address space portion and a non-addressable memory address space portion when at least one of the cells is defective after the first and second dice are arranged in the stack, the memory address space including addresses mapped to the cells, wherein the addressable memory address space portion is a contiguous memory address space portion.

5. The apparatus of claim 4, wherein the non-addressable memory address space portion is a contiguous memory address space portion.

6. An apparatus comprising:
   a first die including cells; and
   a second die arranged in a stack with the first die and configured to organize a memory address space into an addressable memory address space portion and a non-addressable memory address space portion when at least one of the cells is defective after the first and second dice are arranged in the stack, the memory address space including addresses mapped to the cells;
   at least one additional die arranged in the stack and including additional cells, wherein the memory address space includes addresses of the additional cells, and the second die is configured to remap at least one address of at least one defective cell among the cells of the first die and the additional cells to at least one non-defective cell among the cells of the first die and the additional cells.

7. The apparatus of claim 6, wherein the first, second, and additional dice are enclosed in an integrated circuit package such that the second die is closest to a base of the integrated circuit package.

8. An apparatus comprising:
   a first die including cells; and
   a second die arranged in a stack with the first die and configured to organize a memory address space into an addressable memory address space portion and a non-addressable memory address space portion when at least one of the cells is defective after the first and second dice are arranged in the stack, the memory address space including addresses mapped to the cells, wherein at least one of the first and second dice include at least one spare cell to replace a defective cell in one of the first and second dice, and the second die is configured to organize the memory address space when no more spare cells are available.

9. A system comprising:
   a processor; and
   a memory device coupled to the processor, the memory device including:
   a first die including cells; and
   a second die arranged in a stack with the first die and configured to organize a memory address space into an addressable memory address space portion and a non-addressable memory address space portion when at least one of the cells is defective after the first and second dice are arranged in the stack, the memory address space including addresses mapped to the cells, wherein at least one address in the addressable memory address space portion is mapped to at least one non-defective cell among the cells and at least one address in the non-addressable memory address space portion is mapped to at least one defective cell among the cells, and the addressable memory address space portion is a contiguous memory address space portion.

10. The system of claim 9, wherein the memory device is configured to disable at least one address in the non-addressable memory address space portion.

11. A system comprising:
   a processor; and
   a memory device coupled to the processor, the memory device including:
   a first die including cells; and
   a second die arranged in a stack with the first die and configured to organize a memory address space into an addressable memory address space portion and a non-addressable memory address space portion when at least one of the cells is defective after the first and second dice are arranged in the stack, the memory address space including addresses mapped to the cells, wherein the memory device is configured to provide the processor the addressable memory address space portion during an initialization period.

12. The method of claim 11 further comprising:
making addresses in the non-addressable memory address space portion unavailable.

13. A method comprising:
organizing a memory address space into an addressable memory address space portion and a non-addressable memory address space portion when at least one cell among cells of a first die and a second die is defective after the first and second dice are stacked, the memory address space including addresses mapped to the cells, wherein the addressable memory address space portion is a contiguous addressable space portion.

14. The method of claim 13, wherein an address in the addressable memory address space portion is mapped to at a non-defective cell among the cells, and an address in the non-addressable memory address space portion is mapped to a defective cell among the cells.

15. The method of claim 13, wherein addresses in the addressable memory address space portion have higher values than addresses in the non-addressable memory address space portion.

16. The method of claim 13, wherein addresses in the addressable memory address space portion have lower values than addresses in the non-addressable memory address space portion.

* * * * *

UNITED STATES PATENT AND TRADEMARK OFFICE
CERTIFICATE OF CORRECTION

PATENT NO.       : 8,320,206 B2                                        Page 1 of 1
APPLICATION NO.  : 12/946592
DATED            : November 27, 2012
INVENTOR(S)      : Brent Keeth et al.

It is certified that error appears in the above-identified patent and that said Letters Patent is hereby corrected as shown below:

In the Claims:

In column 15, line 9, in claim 12, delete "method" and insert -- system --, therefor.

Signed and Sealed this
Sixteenth Day of July, 2013

Teresa Stanek Rea
*Acting Director of the United States Patent and Trademark Office*